(12) United States Patent
Kouassi

(10) Patent No.: US 7,704,630 B2
(45) Date of Patent: Apr. 27, 2010

(54) FUEL CELL WITH A LARGE EXCHANGE SURFACE AREA

(75) Inventor: Sébastien Kouassi, Joue les Tours (FR)

(73) Assignee: STMicroelectronics S.A., Montrouge (FR)

( * ) Notice: Subject to any disclaimer, the term of this patent is extended or adjusted under 35 U.S.C. 154(b) by 661 days.

(21) Appl. No.: 11/529,637

(22) Filed: Sep. 28, 2006

(65) Prior Publication Data

US 2007/0072032 A1 Mar. 29, 2007

(30) Foreign Application Priority Data

Sep. 29, 2005 (FR) .................................. 05 52943

(51) Int. Cl.
*H01M 4/00* (2006.01)
(52) U.S. Cl. ..................... 429/44; 429/40; 429/38; 502/101
(58) Field of Classification Search ............... 429/27, 429/30, 32, 40, 42, 44; 502/101
See application file for complete search history.

(56) References Cited

U.S. PATENT DOCUMENTS

| 4,180,416 A | 12/1979 | Brock |
| 5,759,712 A | 6/1998 | Hockaday et al. |
| 6,444,602 B1 | 9/2002 | DeMarinis et al. |
| 2002/0020053 A1* | 2/2002 | Fonash et al. ............ 29/623.1 |
| 2003/0003347 A1 | 1/2003 | D'Arrigo et al. |
| 2003/0096146 A1 | 5/2003 | Foster |
| 2004/0055894 A1 | 3/2004 | Iwasaki et al. |
| 2004/0197638 A1 | 10/2004 | McElrath et al. |
| 2004/0259315 A1 | 12/2004 | Sakaguchi et al. |

FOREIGN PATENT DOCUMENTS

| DE | 199 41 048 A1 | 3/2001 |
| FR | 2 846 797 A1 | 12/2001 |
| WO | WO 0137357 A | 5/2001 |
| WO | WO 2004/091026 A | 10/2004 |

OTHER PUBLICATIONS

French Search Report from French Patent Application 05/52943, filed Sep. 29, 2005.
French Search Report from French Patent Application 05/52944, filed Sep. 29, 2005.

* cited by examiner

*Primary Examiner*—Patrick Ryan
*Assistant Examiner*—Ben Lewis
(74) *Attorney, Agent, or Firm*—Lisa K. Jorgenson; James H. Morris; Wolf, Greenfield & Sacks, P.C.

(57) ABSTRACT

A support wafer made of silicon wafer comprising, on a first surface a porous silicon layer having protrusions, porous silicon pillars extending from the porous silicon layer to the second surface of the wafer, in front of each protrusion. Layers constituting a fuel cell can be formed on the support wafer.

9 Claims, 4 Drawing Sheets

FUEL CELL WITH A LARGE EXCHANGE SURFACE AREA

BACKGROUND OF THE INVENTION

1. Field of the Invention

The present invention relates to a method for forming a fuel cell.

2. Discussion of the Related Art

Integrated fuel cells formed on silicon wafer are known. A drawback of the usual structures lies in the limited exchange surface area between the active component (for example hydrogen) arriving from apertures through the silicon wafer and an active layer of the cell.

SUMMARY OF THE INVENTION

The present invention provides a new fuel cell structure and a suitable support wafer.

The present invention also provides a method for manufacturing a fuel cell support wafer and a method for manufacturing a fuel cell.

An embodiment of the present invention provides a method for forming a support wafer from a silicon wafer, comprising the steps of forming, according to a TGZM method, aluminum-silicon pillars crossing the silicon wafer; forming cavities in a first surface of the silicon wafer outside of the areas corresponding to the pillars; diffusing a dopant material such as boron into said first surface of the wafer to form doped silicon portions; and performing an electrolysis of the silicon wafer, whereby said aluminum-silicon pillars and said doped silicon portions are turned into porous silicon.

Another embodiment of the present invention provides a method for forming a fuel cell on a support wafer as above, and further comprising the steps of performing a conformal deposition, on said first surface of the wafer, of a first conductive layer intended to be connected to an anode collector; forming through openings in the first conductive layer; successively performing conformal depositions of a first catalyst layer, of an electrolyte layer, and of a second catalyst layer on the first conductive layer; performing a conformal deposition, on the second catalyst layer, of a second conductive layer intended to be connected to a cathode collector; and forming through openings in the second conductive layer.

Another embodiment of the present invention provides a support wafer made of silicon wafer comprising, on a first surface a porous silicon layer having protrusions, porous silicon pillars extending from the porous silicon layer to the second surface of the wafer, in front of each protrusion. Another embodiment of the present invention provides a fuel cell formed on the above support wafer.

According to an embodiment of the present invention the fuel cell comprises, on the first surface of the support wafer, a first conductive layer intended to be connected to an anode collector and exhibiting through openings above the porous silicon portions, a superposition of a first catalyst layer, of an electrolyte layer, and of a second catalyst layer on the first conductive layer, as well as a second conductive layer intended to be connected to a cathode collector and exhibiting through openings.

The foregoing and other objects, features, and advantages of the present invention will be discussed in detail in the following non-limiting description of specific embodiments in connection with the accompanying drawings.

BRIEF DESCRIPTION OF THE DRAWINGS

FIG. 2A is a cross-section view of an electrolysis device in which the last step of a porous silicon pillar forming method is performed;

DETAILED DESCRIPTION

Figure 1:
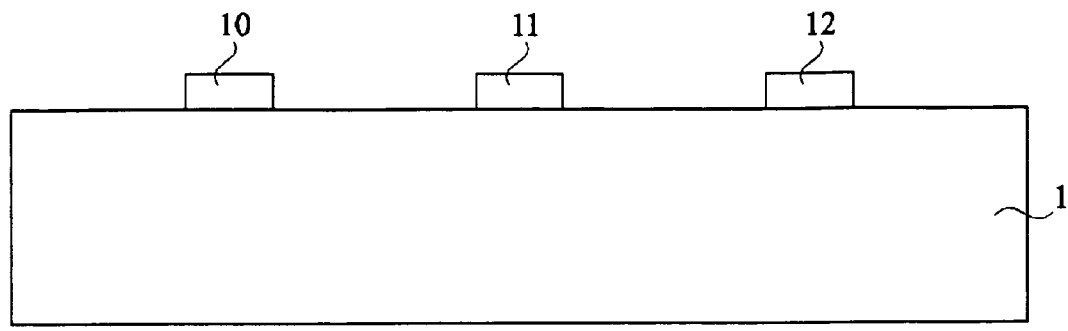
FIGS. 1, 2A, and 2B are cross-section views illustrating first successive steps of a method for forming porous silicon pillars through a silicon wafer.

For clarity, the same elements have been designated with the same reference numerals in the different drawings and, further, as usual in the representation of semiconductor structures, the various drawings are out of scale.

The present invention uses a silicon wafer, in which porous silicon portions having the shape of through pillars and exhibiting substantially rectilinear walls perpendicular to the main wafer surfaces have been formed. The method comprises the initial forming of the through pillars with aluminum-silicon according to a "temperature gradient zone melting" method (TGZM), followed by the electrolytic turning of the silicon-aluminum pillars into porous silicon pillars.

In an initial step, illustrated in FIG. 1, an aluminum layer is deposited on a silicon wafer 1 and etched to keep aluminum portions 10, 11, and 12.

Figure 2A:
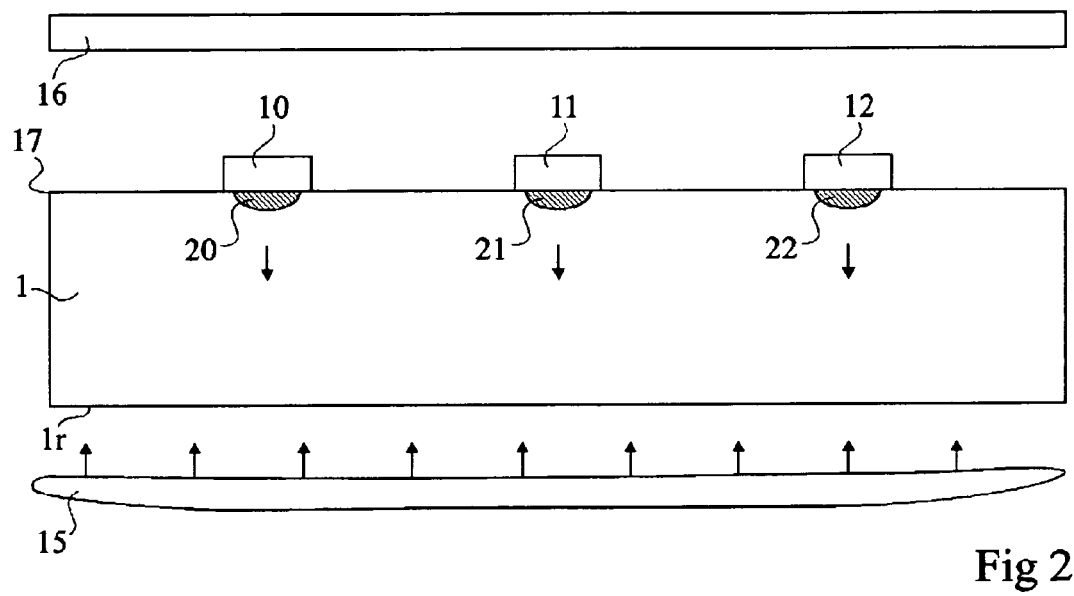

At the next step, illustrated in FIG. 2A, the previously-obtained structure is placed in a heating enclosure. It is seen to it that a temperature gradient between upper surface $1f$ of the silicon wafer where aluminum portions 10, 11, and 12 are laid and lower surface $1f$ of the wafer is present in the heating enclosure. For this purpose, a heat source 15 is placed on the rear surface side of the wafer and a black body 16 is placed on the upper surface side of the wafer. The gradient for example is of 100 degrees per cm, which corresponds to a temperature difference of approximately 3° C. for a 300-µm wafer. Further, the temperatures of the different portions of the heating enclosure, or more specifically of the wafer, are greater than the melting temperature of aluminum and smaller than the melting temperature of silicon. A temperature on the order of 1,280° C. is, for example, selected.

Aluminum portions 10, 11, and 12 start melting and their melting causes a melting of the neighboring silicon. Under the surface of aluminum portions 10, 11, and 12, liquid aluminum-silicon areas 20, 21, 22 form. The temperature of lower surface $1r$ of the wafer being greater than that of upper surface $1f$, the silicon melting, induced by aluminum-silicon areas 20, 21, 22, is preferentially performed on the lower surface side. Thereby, liquid aluminum-silicon areas 20, 21, 22 progressively extend to lower surface $1r$, until reaching the latter. During the "progress" of liquid aluminum-silicon areas 20, 21, 22, an aluminum-silicon precipitate forms on the side of upper surface $1f$. All occurs as if aluminum portions 10, 11, 12 were moving through silicon wafer 1 from the upper surface to the lower surface by leaving on their way solid aluminum-silicon portions.

Figure 2B:
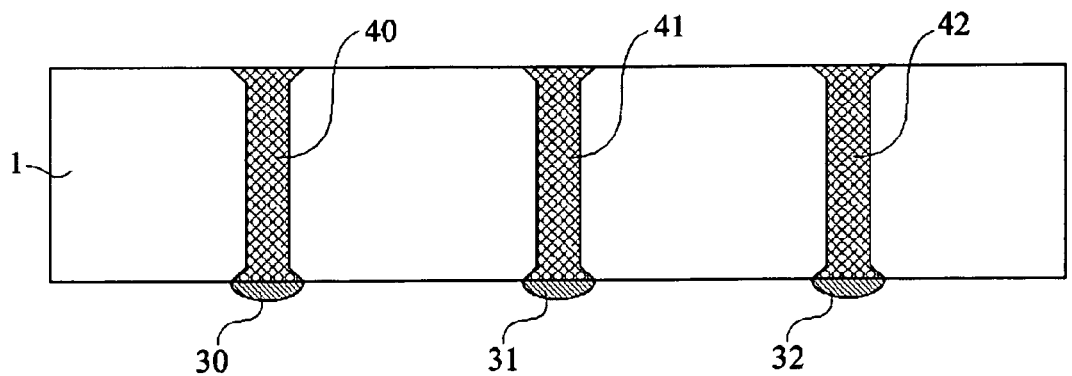

In a next step, illustrated in FIG. 2B, wafer 1 is removed from the heating enclosure. Aluminum-silicon portions 30, 31, 32 super-saturated with aluminum and covered with alumina are present on the lower surface of wafer 1. Aluminum-silicon pillars 40, 41, 42 are formed across the entire thickness of wafer 1.

It should be noted that, in the heating enclosure, the forming of aluminum-silicon carries on as long as aluminum portions 10, 11, 12 have not totally reacted. In the case where the aluminum quantity of each portion 10, 11, and 12 is greater than the quantity necessary to form an aluminum-silicon pillar across the entire thickness of wafer 1, aluminum-silicon portions 30, 31, 32 keep on reacting with silicon, by extending laterally at the surface of rear surface of wafer 1. In the case where it is not desired to have such a lateral extension, a control system detecting the forming of aluminum-silicon portions 30, 31, 32 may be used.

Aluminum-silicon portions 30, 31, 32 are then eliminated, for example, by polishing.

In what follows, the surface of wafer 1 on which aluminum has initially been deposited will be called front surface 1f and the opposite surface will be called rear surface 1r.

Figure 3A:
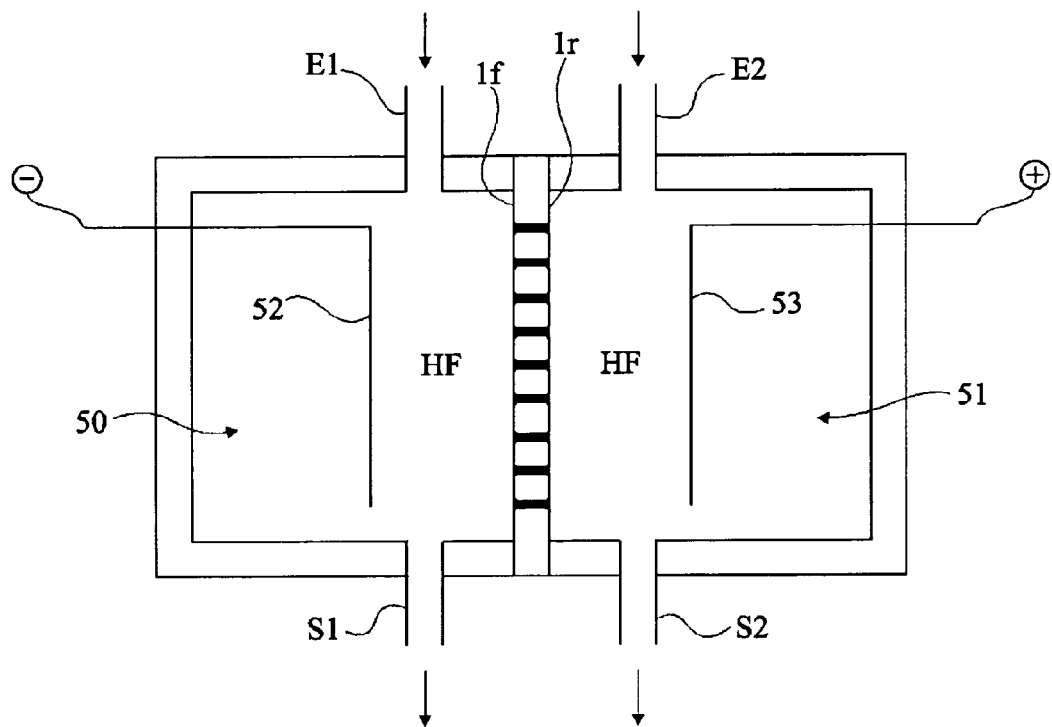
FIG. 3B is a cross-section view of a final structure obtained at the end of the porous silicon pillar forming method.

At the next step, illustrated in FIG. 3A, an electrolysis of the previously-obtained structure is performed. The electrolysis device comprises two hydrofluoric acid baths 50 and 51, in which are plunged platinum electrodes 52 and 53, respectively connected to negative and positive terminals of a supply voltage. The hydrofluoric acid of baths 50 and 51 is regularly renewed through inlets E1 and E2 and outlets S1 and S2 of baths 50 and 51.

It should be noted that another electrolysis device may be used. One of the wafer surfaces may for example be placed in contact with a hydrofluoric acid and another surface in contact with a metal electrode.

In this example, front surface 1f of wafer 1 is in contact with bath 50 connected to the negative terminal. Previously-formed aluminum-silicon pillars 40, 41, 42 progressively turn into porous silicon, where the portions in contact with bath 50 transform first.

It should be noted that the wafer direction is of no importance. Front surface 1f of the wafer could be in contact with bath 51 connected to the positive terminal.

It should be noted that to obtain porous silicon across the entire thickness of the silicon wafer, the "etching" of the aluminum-silicon portions should be performed smoothly with a low electrolysis current and hydrofluoric acid concentration.

As a non-limiting indication, for a 300-μm wafer, baths exhibiting a 30% hydrofluoric acid concentration and a 200-mA/cm² electrolysis current density may be used.

Figure 3B:
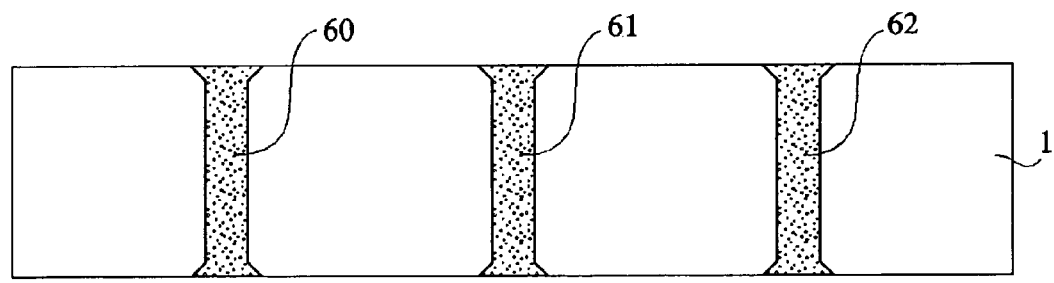

As illustrated in FIG. 3B, after the electrolysis step, porous silicon pillars 60, 61, and 62 crossing silicon wafer 1 are obtained.

It should be noted that the walls of pillars 60, 61, and 62 are substantially rectilinear across the entire wafer thickness, except close to the front and rear surfaces where they are more flared.

The above method enables forming very precisely delimited porous silicon pillars. Indeed, it is possible to form pillars exhibiting a diameter, or a thickness, of a few micrometers through a wafer that may have a thickness greater than a few millimeters, or even a few centimeters.

The present invention uses the above method to form a fuel cell support, as described hereafter in relation with FIGS. 4A to 4H.

Figure 4A:
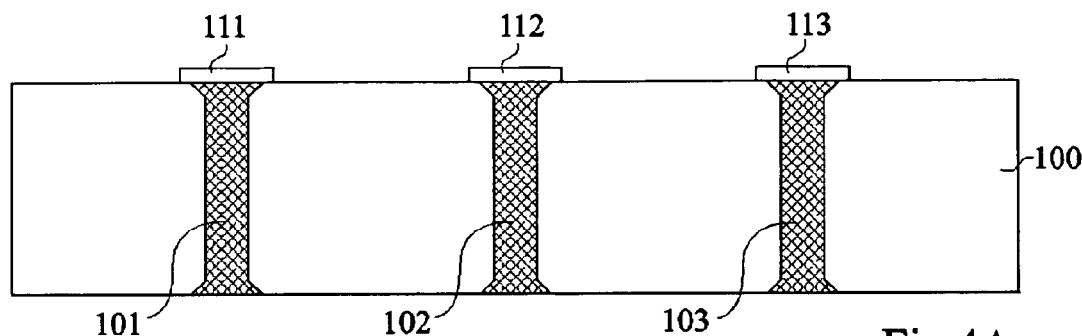
FIGS. 4A to 4H are cross-section views of structures obtained on successive steps of a method for forming a fuel cell on a support wafer formed according to the method of the present invention.

In an initial step, illustrated in FIG. 4A, aluminum-silicon pillars 101, 102, 103 are formed in a silicon wafer 100 according to the TGZM method previously described in relation with FIGS. 2A and 2B.

A protection layer is then deposited on silicon wafer 100 and etched to keep protection blocks 111, 112, and 113 above aluminum-silicon pillars 101, 102, and 103. The protection blocks are for example formed of silicon oxide.

It should be noted that the protection blocks may be placed on any one of the wafer surfaces.

According to an alternative embodiment, the aluminum-silicon portions covered with alumina present at the rear surface of the silicon wafer after forming of pillars 101, 102, and 103 according to the TGZM method are used as protection blocks.

Figure 4B:
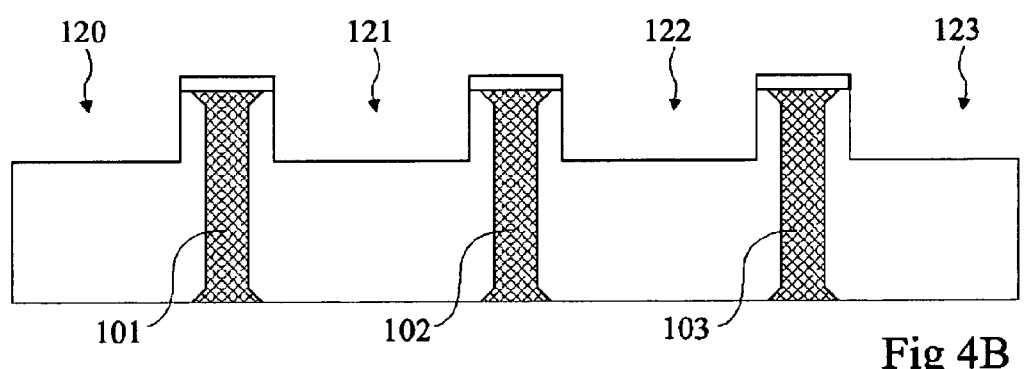

At the next step, illustrated in FIG. 4B, the upper portion of wafer 100 is etched to form cavities 120, 121, 122, and 123 between aluminum-silicon pillars 101, 102, and 103 and on the side of pillars 101 and 103. Protection blocks 110, 111, and 112 are then eliminated.

Figure 4C:
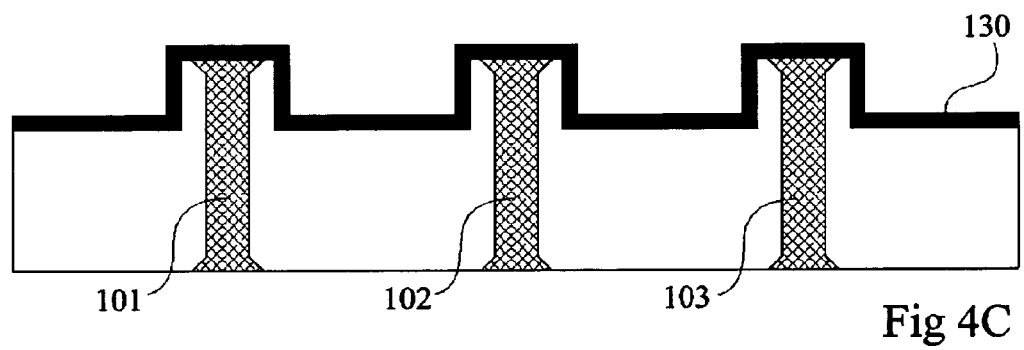

At the next step, illustrated in FIG. 4C, a surface layer saturated with boron 130 is deposited on the previously-obtained structure. The wafer is then placed in a heating enclosure to diffuse the boron into the upper portion of the wafer.

Figure 4D:
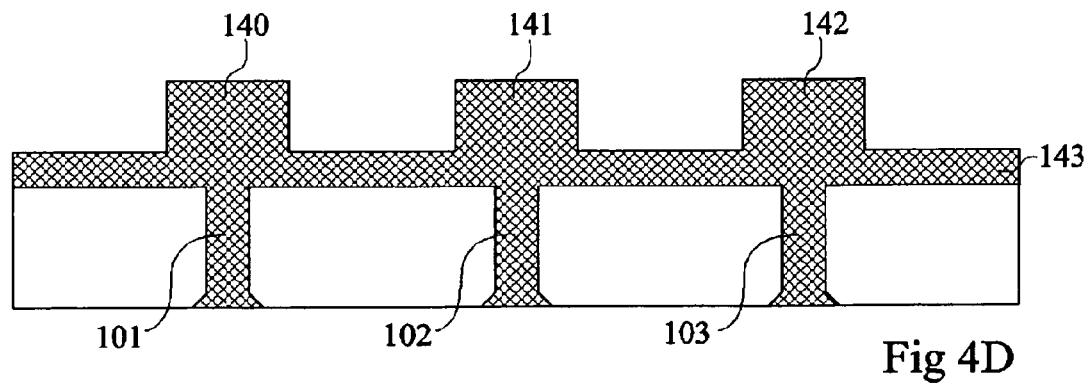

At the next step, illustrated in FIG. 4D, surface layer 130 is eliminated. The upper portion of wafer 100 is then entirely P-type doped. Cavities 120, 121, 122, and 123 are surrounded with doped silicon portions 140,141, 142. Further, a thin doped silicon layer 143 is formed under cavities 120 to 123.

According to an alternative embodiment of the steps illustrated in FIGS. 4A to 4D, it is possible to cover silicon wafer 100 with a surface layer saturated with boron, to diffuse the boron into the upper portion of the wafer to form a P-type doped silicon layer, then to form, by etching, cavities in the doped silicon layer. The depth of the cavities must then be smaller than the thickness of the doped silicon layer to obtain a structure identical to that shown in FIG. 4D.

Figure 4E:
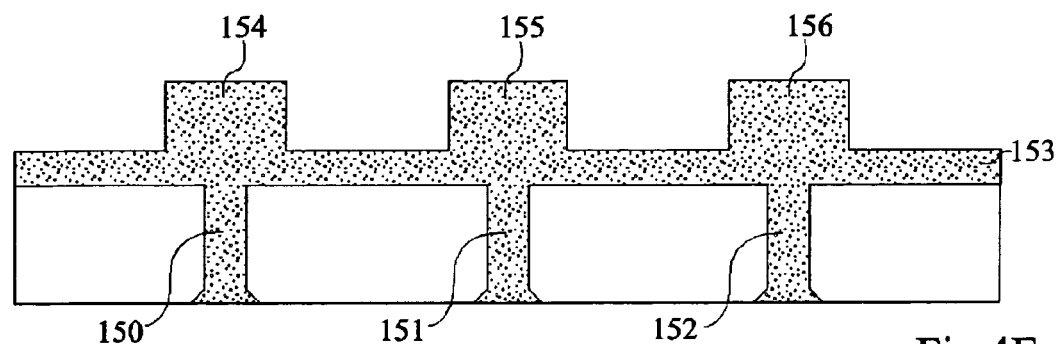

At the next step, illustrated in FIG. 4E, an electrolysis of the previously-obtained structure is performed in a device such as that shown in FIG. 3A. At the end of this electrolysis, aluminum-silicon pillars 101, 102, 103, thin doped silicon layer 143, and doped silicon portions 140, 141, and 142 are turned into porous silicon. Pillars 150, 151, and 152, a thin layer 153, and portions 154, 155, and 156 made of porous silicon are then obtained.

It is possible to diffuse into the wafer a dopant material other than boron. The doped silicon portions obtained after diffusion must be able to turn into porous silicon during the electrolysis step.

Figure 4F:
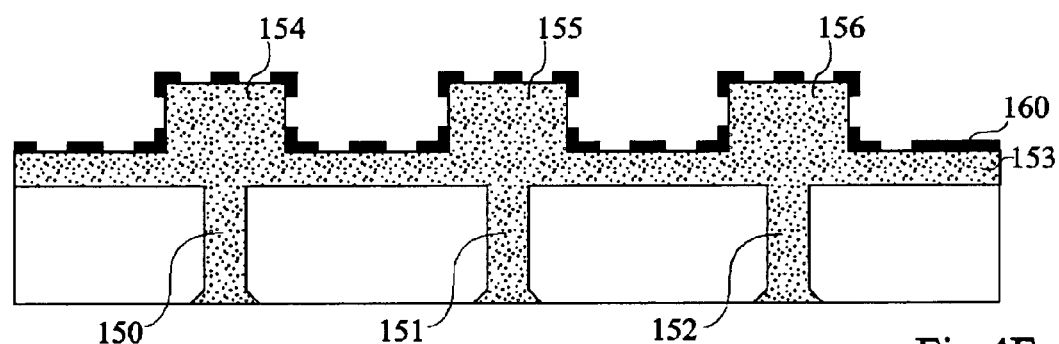

At the step illustrated in FIG. 4F, a conformal deposition of a conductive layer 160 on the previously-obtained structure is performed above porous silicon portions 154, 155, 156 and thin layer 153. Through openings are then formed in conductive layer 160.

Figure 4G:
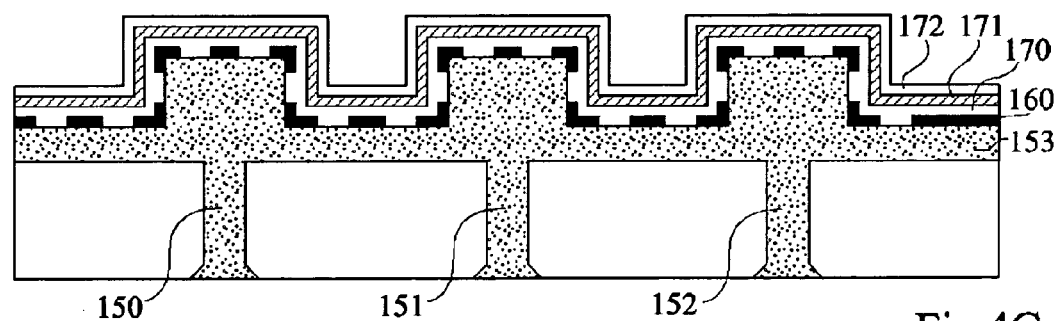

At the step illustrated in FIG. 4G, conformal depositions of a catalyst layer 170, of an electrolyte layer 171, and of a catalyst layer 172 on conductive layer 160 are successively performed.

Figure 4H:
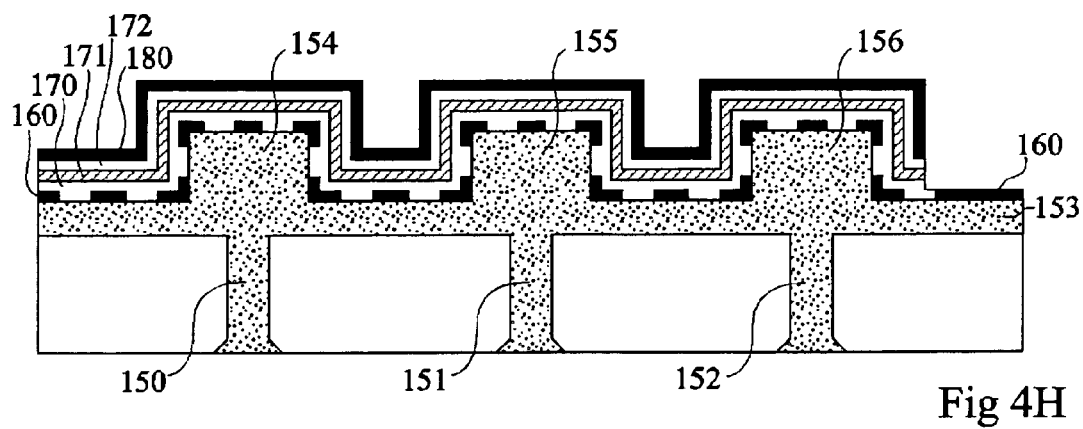

At the step illustrated in FIG. 4H, a conformal deposition of a conductive layer 180 is performed on catalyst layer 172. Through openings are then formed in conductive layer 180. Several successive etchings of layers 180, 172, 171, and 170 are then performed to form an access 190 to conductive layer 160.

Conductive layer 160 forms an anode collector, conductive layer 180 forming a cathode collector. Pillars 150, 151, and 152, thin layer 153, and porous silicon portions 154, 155, and 156 form supply lines of a gas such as hydrogen.

In operation, the hydrogen is "decomposed" at the level of catalyst layer 170 to form, on the one hand, $H^+$ protons which direct towards electrolyte layer 171 and, on the other hand, the electrons which direct towards anode connector 160. The $H^+$ protons cross electrolyte layer 171 to reach catalyst layer 172 where they recombine with oxygen arriving from the top of the cell through the openings formed in cathode conductive layer 180 and electrons arriving through cathode collector 172. A positive voltage is then obtained on cathode collector 180, on the oxygen side, and a negative voltage is obtained on anode collector 160.

An advantage of the cell shown in FIG. 4H, and formed according to the above-mentioned method, is that it exhibits a very wide surface area of exchange between the hydrogen and catalyst layer 170. Indeed, the hydrogen arriving through the pillars 150-152 is distributed on substantially all the surface of the catalyst layer 170 due to the presence of thicker portions 154-156 of porous silicon that act as shower head.

It should further be noted that the first part of the previously-described method provides a new support wafer structure, shown in FIG. 4E.

The forming of such a structure by means of known methods for forming and etching porous silicon would comprise the performing of a first electrolysis of a silicon wafer to form through pillars by using masks provided with openings, followed by a second electrolysis to turn into porous silicon an upper portion of the wafer, then the etching of cavities in the upper portion of the porous silicon wafer. Such a method would require long hours of electrolysis, and would not enable forming narrow pillars. Further, porous silicon etch methods are very difficult to implement and many fractures of the porous silicon can be observed.

The method of the present invention enables, in addition to through pillars, forming porous silicon portions of various shapes. The definition of these various shapes may be performed by means of doping and etch methods which are easy to implement. Further, the porous silicon being formed last, the wafer, and especially the porous areas, are not weakened by subsequent shape definition etchings.

Of course, the present invention is likely to have various, alterations, improvements, and modifications which will readily occur to those skilled in the art. In particular, those skilled in the art may devise other structures of fuel cell supports manufactured according to the method of the present invention. Hydrogen ducts comprising through porous silicon pillars and a thin porous silicon layer formed on one of the surfaces of a silicon wafer on which are placed the different layers forming the fuel cell may for example be provided in a silicon wafer. Further, the actual forming of a fuel cell on such supports may be performed according to various methods.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A non-porous support wafer made of silicon wafer comprising, on a first surface a porous silicon layer having protrusions, porous silicon pillars extending from the porous silicon layer through the non-porous support wafer to the second surface of the non-porous support wafer, in front of each protrusion.

2. A fuel cell formed on the support wafer of claim 1.

3. The fuel cell of claim 2, comprising, on the first surface of the non-porous support wafer, a first conductive layer intended to be connected to an anode collector and exhibiting through openings above the porous silicon portions, a superposition of a first catalyst layer, of an electrolyte layer, and of a second catalyst layer on the first conductive layer, as well as a second conductive layer intended to be connected to a cathode collector and exhibiting through openings.

4. A fuel cell, comprising:
a non-porous support wafer fabricated from a silicon wafer, the non-porous support wafer including a porous silicon layer having a plurality of protrusions on a first surface of the non-porous support wafer, the non-porous support wafer further including a plurality of porous silicon pillars extending from the porous silicon layer to a second surface of the non-porous support wafer opposite the first surface, each porous silicon pillar being located in a region of the non-porous support wafer corresponding to a protrusion;
first and second catalyst layers, the first catalyst layer adapted to be connected to an anode collector and the second catalyst layer adapted to be connected to a cathode collector;
an electrolyte layer disposed between the first and second catalyst layers;
a first conductive layer disposed between the porous silicon layer and the first catalyst layer, the first conductive layer having a plurality of through openings adapted to allow passage of a first gas from the porous silicon pillars and the porous silicon layer to the first catalyst layer; and
a second conductive layer disposed on the second catalyst layer, the second conductive layer having a plurality of through openings adapted to allow passage of a second gas to the second catalyst layer.

5. The fuel cell of claim 4, wherein the porous silicon layer has a plurality of cavities formed in a surface thereof, adjacent protrusions being separated by at least one of the cavities.

6. The fuel cell of claim 5, wherein the porous silicon layer has a non-planar surface, each of the first and second catalyst layers, the electrolyte layer and the first and second conductive layers has a non-planar configuration that conforms to the non-planar surface.

7. A fuel cell, comprising:
a non-porous support wafer fabricated from a silicon wafer, the non-porous support wafer including a porous silicon layer on a first surface of the silicon wafer and a plurality of porous silicon pillars extending from the porous silicon layer and through the non-porous support wafer to a second surface of the non-porous support wafer opposite the first surface, the porous silicon layer adapted to receive a first gas presented to the second surface of the non-porous support wafer through the porous silicon pillars, the porous silicon layer having a first surface area and the second surface having a second surface area that is less than the first surface area;
first and second catalyst layers, the first catalyst layer adapted to be connected to an anode collector and the second catalyst layer adapted to be connected to a cathode collector;
an electrolyte layer disposed between the first and second catalyst layers;
a first conductive layer disposed between the porous silicone layer and the first catalyst layer, the first conductive layer having a plurality of through openings adapted to allow passage of the first gas from the porous silicone pillars and the porous silicone layer to the first catalyst layer; and
a second conductive layer disposed on the second catalyst layer, the second conductive layer having a plurality of through openings adapted to allow passage of a second gas to the second catalyst layer.

8. The fuel cell of claim 7, wherein the porous silicon layer has a non-planar surface and the second surface of the support wafer is planar.

9. The fuel cell of claim 8, wherein each of the first and second catalyst layers, the electrolyte layer and the first and second conductive layers has a non-planar configuration that conforms to the non-planar surface of the porous silicon layer.

* * * * *